US006806593B2

(12) United States Patent
Tai et al.

(10) Patent No.: US 6,806,593 B2
(45) Date of Patent: Oct. 19, 2004

(54) THIN FILM ELECTRET MICROPHONE

(75) Inventors: Yu-Chong Tai, Pasadena, CA (US); Tseng-Yang Hsu, Pasadena, CA (US); Wen H. Hsieh, Arcadia, CA (US)

(73) Assignee: California Institute of Technology, Pasadena, CA (US)

(*) Notice: Subject to any disclaimer, the term of this patent is extended or adjusted under 35 U.S.C. 154(b) by 16 days.

(21) Appl. No.: 09/859,191

(22) Filed: May 15, 2001

(65) Prior Publication Data

US 2001/0033670 A1 Oct. 25, 2001

Related U.S. Application Data

(62) Division of application No. 08/844,570, filed on Apr. 18, 1997, now Pat. No. 6,243,474.
(60) Provisional application No. 60/016,056, filed on Apr. 18, 1996.

(51) Int. Cl.[7] .................................. G11C 13/02
(52) U.S. Cl. ................ 307/400; 29/886; 29/594; 361/283.1; 367/170; 381/174; 381/191
(58) Field of Search ................ 307/400; 29/886, 29/594; 361/283.1; 381/174, 191; 367/170

(56) References Cited

U.S. PATENT DOCUMENTS

| | | | | |
|---|---|---|---|---|
| 3,660,736 A | | 5/1972 | Igarashi et al. | 317/262 |
| 3,924,324 A | * | 12/1975 | Kidera | 29/592 |
| 4,429,192 A | | 1/1984 | Busch-Vishniac et al. | 179/111 |
| 4,524,247 A | | 6/1985 | Lindenberger et al. | 179/111 |
| 4,764,690 A | | 8/1988 | Murphy et al. | 307/400 |
| 4,908,805 A | * | 3/1990 | Sprenkels et al. | 367/181 |
| 4,910,840 A | | 3/1990 | Sprenkels et al. | 29/254.1 |
| 5,408,731 A | | 4/1995 | Berggvist et al. | 29/25.41 |
| 5,573,679 A | * | 11/1996 | Mitchell et al. | 216/2 |
| 5,881,158 A | * | 3/1999 | Lesinski | 381/174 |

FOREIGN PATENT DOCUMENTS

| | | |
|---|---|---|
| CA | 970884 | 7/1975 |
| JP | 56-50408 | 11/1981 |
| JP | 06-217397 | 8/1994 |
| WO | WO89/04881 | 6/1989 |

* cited by examiner

*Primary Examiner*—Robert DeBeradinis
(74) *Attorney, Agent, or Firm*—Fish & Richardson P.C.

(57) ABSTRACT

An electret formed by micro-machining technology on a support surface, including a self-powered electret sound transducer, preferably in the form of a microphone, formed by micro-machining technology. Each microphone is manufactured as a two-piece unit, comprising a microphone membrane unit and a microphone back plate, at least one of which includes an electret formed by micro-machining technology. When juxtaposed, the two units form a microphone that can produce a signal without the need for external biasing, thereby reducing system volume and complexity. The electret material used is a thin film of spin-on polytetrafluoroethylene (PTFE). An electron gun preferably is used for charge implantation. The electret has a saturated charged density in the range of about $2\times10^{-5}$ C/m$^2$ to about $8\times10^{-4}$ C/m$^2$. Thermal annealing is used to stabilize the implanted charge. An open circuit sensitivity of about 0.5 mV/Pa has been achieved for a hybrid microphone package.

24 Claims, 3 Drawing Sheets

FIG. 1A
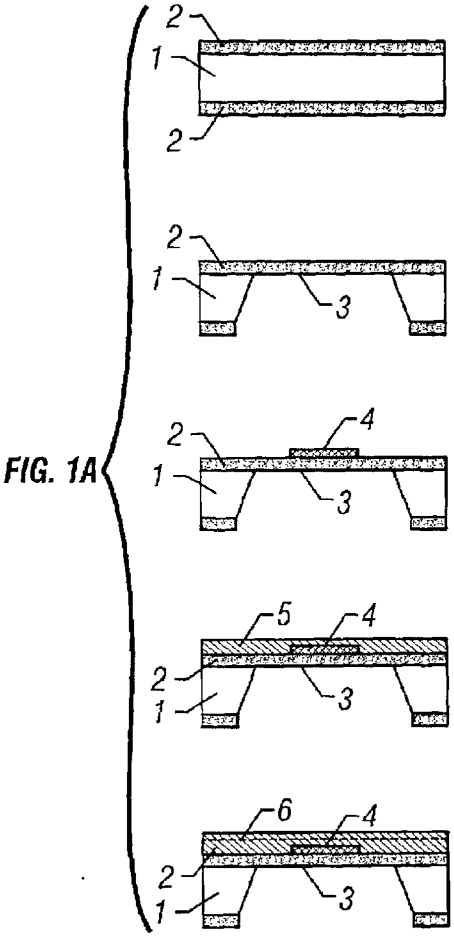
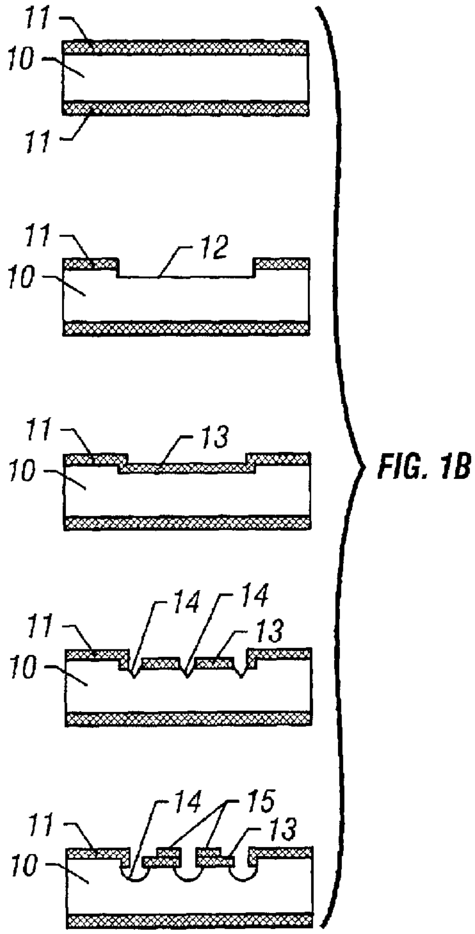
FIG. 1B
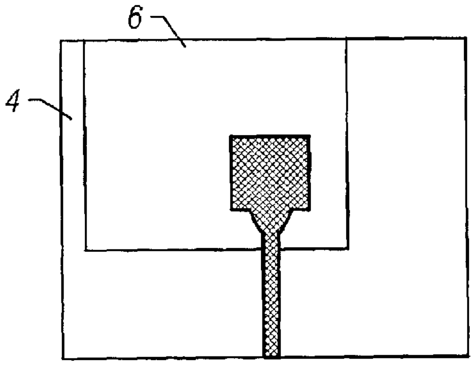
FIG. 2A
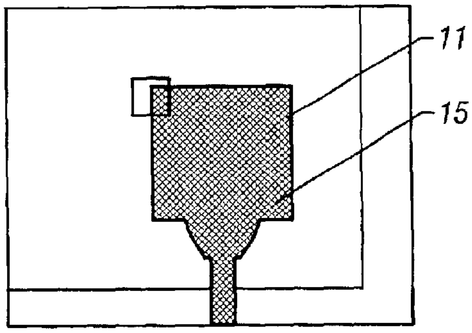
FIG. 2B

THIN FILM ELECTRET MICROPHONE

CROSS-REFERENCE TO RELATED APPLICATION

This application is a divisional and claims benefit of the priority of U.S. patent application Ser. No. 08/844,570, filed Apr. 18, 1997, now U.S. Pat. No. 6,243,474, which claims priority from provisional application No. 60/016,056 filed on Apr. 18, 1996.

STATEMENT AS TO FEDERALLY SPONSORED RESEARCH

The U.S. Government has certain rights in this invention pursuant to Grant No. ECS-9157844 awarded by the National Science Foundation.

BACKGROUND OF THE INVENTION

1. Field of the Invention

This invention relates to electret microphones, and more particularly to miniature electret microphones and methods for manufacturing miniature electret microphones.

2. Description of Related Art

An electret is a dielectric that produces a permanent external electric field which results from permanent ordering of molecular dipoles or from stable uncompensated surface or space charge. Electrets have been the subject of study for their charge storage characteristics as well as for their application in a wide variety of devices such as acoustic transducers (including, for example, hearing aids), electrographic devices, and photocopy machines.

A number of electret microphone designs exist. However, small, high quality electret microphones tend to be quite expensive. Therefore, a need exists for small, high quality, inexpensive electrets, particularly electret microphones. The present invention meets these needs.

SUMMARY OF THE INVENTION

The present invention uses micro-machining technology to fabricate a small, inexpensive, high quality electret on a support surface, and further uses micro-machining technology to fabricate a small, inexpensive, high quality, self-powered electret sound transducer, preferably in the form of a microphone. Each microphone is manufactured as a two-piece unit, comprising a microphone membrane unit and a microphone back plate, at least one of which includes an electret formed by micro-machining technology. When juxtaposed, the two units form a highly reliable, inexpensive microphone that can produce a signal without the need for external biasing, thereby reducing system volume and complexity.

In the preferred embodiment, the electret material used is a thin film of spin-on polytetrafluoroethylene (PTFE). An electron gun preferably is used for charge implantation. The electret has a saturated charged density in the range of about $2\times10^{-5}$ C/m$^2$ to about $8\times10^{-4}$ C/m$^2$. Thermal annealing is used to stabilize the implanted charge.

Two prototype micro-machined electret microphones have been fabricated and tested. An open circuit sensitivity of about 0.5 mV/Pa has been achieved for a hybrid microphone package.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 1A is a process flow chart for the electret microphone of a first embodiment of the present invention, showing fabrication stages for the microphone membrane.

FIG. 1B is a process flow chart for the electret microphone of a first embodiment of the present invention, showing fabrication stages for the microphone back plate.

FIG. 2A is a plan view of the completed microphone membrane of FIG. 1A.

FIG. 2B is a plan view of the completed microphone back plate of FIG. 1B.

Like reference numbers and designations in the various drawings indicate like elements.

DETAILED DESCRIPTION OF THE INVENTION

Figure 2C:
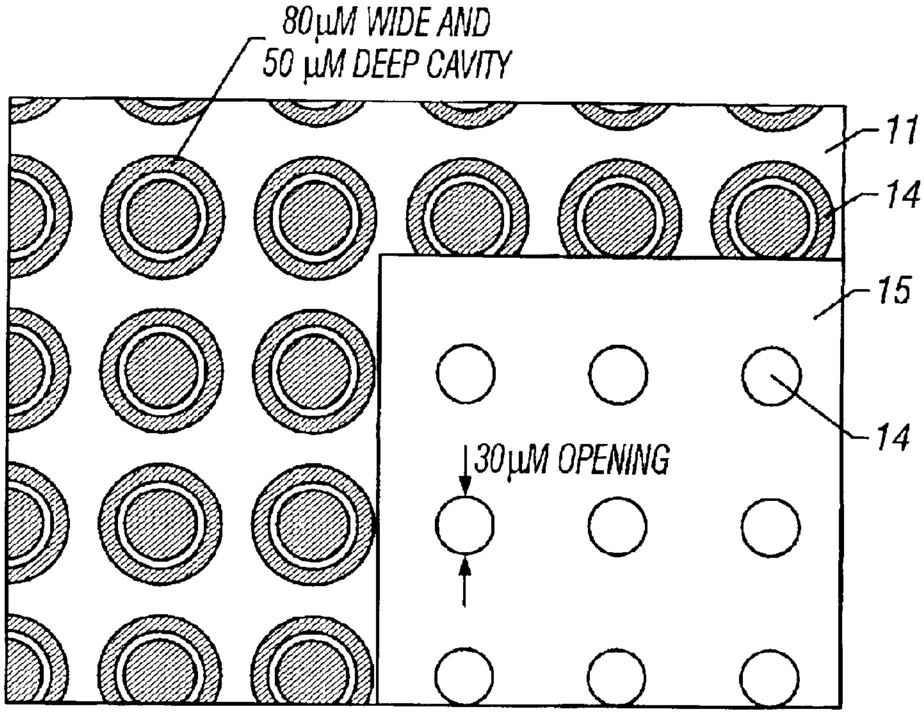
FIG. 2C is a close-up view of a section of the completed microphone back plate of FIG. 2B.

Throughout this description, the preferred embodiment and examples shown should be considered as exemplars, rather than as limitations on the present invention.

Overview

In accordance with the invention, miniature (e.g., 3.5 mm×3.5 mm) electret microphones are manufactured as a two-piece unit comprising a microphone membrane unit and a microphone back plate, at least one of which has an electret formed by micro-machining technology. When juxtaposed, the two units form a microphone that can produce a signal without the need for external biasing. However, the invention includes forming an electret on a support surface for other desired uses.

In the preferred embodiment, the electret material used is a thin film of a spin-on form of polytetrafluoroethylene (PTFE). An electron gun, known as a pseudo-spark device, is used for charge implantation.

To demonstrate the self-powering capability of a Micro Electro-Mechanical Systems (MEMS) compatible electret device, two different prototype micro-machined electret microphones have been fabricated and tested. Prototype A used a silicon back plate, and the prototype B used a glass back plate. Both microphones use the same diaphragm (membrane) chip. In these examples, the electret has a saturated charged density in the range of about $2\times10^{-5}$ C/m$^2$ to about $8\times10^{-4}$ C/m$^2$. An open circuit sensitivity of about 0.5 mV/Pa has been achieved for a hybrid microphone package.

Electret Microphone A

FIG. 1A is a process flow chart for the electret microphone of a first embodiment of the present invention, showing fabrication stages for the microphone membrane. FIG. 2A is a plan view of the completed microphone membrane of FIG. 1A. The fabrication process for electret microphone A involves the following steps:

1) Fabrication of the microphone membrane begins with a silicon substrate 1 coated with about 1 $\mu$m thick, low stress, low pressure chemical vapor deposition (LPCVD) silicon nitride acting as a membrane layer 2. Other electrically insulating or semiconducting glass, ceramic, crystalline, or polycrystalline materials can be used as the substrate material. For example, the substrate material may be glass (see, e.g., Electret Microphone #2 below), quartz, sapphire, etc., all of which can be etched in many known ways. Other membrane layer materials (such as silicon dioxide) capable of being fabricated in a thin layer can be used, formed or deposited in various known ways.

2) The silicon nitride on the back side of the substrate 1 is then masked with photoresist, patterned, and etched (e.g., with $SF_6$ plasma) in conventional fashion to form a back-etch window. The substrate 1 is then anisotropically back-etched to form a free-standing diaphragm 3 (about 3.5 mm×3.5 mm in the illustrated embodiment). The etchant may be, for example, potassium hydroxide (KOH), ethylene diamine pyrocatecol (EDP), or tetramethyl ammonium hydroxide (TMAH).

3) A membrane electrode 4 is then deposited on the front side of the diaphragm 3, preferably by evaporation of about a 2000 Å thick layer of Cr/Au through a photoresist or physical mask. Other conductors may be used, such as aluminum or copper, and deposited in other fashions.

4) A dielectric film 5 is then spun on to a thickness of about 1 μm. The dielectric film 5 preferably comprises PTFE, most preferably Teflon® AF 1601S, a brand of DuPont fluoropolymer. This material was chosen because it is available in liquid form at room temperature, thus making it suitable for spin-on applications. This material also forms an extremely thin film (down to submicron thicknesses) which allows for an increase in the mechanical sensitivity of the microphone membrane, and it has excellent charge storage characteristics, good chemical resistance, low water absorption, and high temperature stability. However, other dielectric materials could be used, such as Mylar, FEP, other PTFE fluoropolymers, silicones, or Parylene.

In the prototype, a Teflon® AF dielectric film was prepared by spinning at about 2 krpm and baking at about 250° C. for about 3 hours. With one application of liquid Teflon® AF followed by spinning, the resulting dielectric film was about 1 μm thick with a surface roughness of less than about 2000 Å across the substrate (microphone A). With two consecutive applications of liquid Teflon® AF, the resulting dielectric film was about 1.2 μm thick (microphone B). For time spans longer than usual processing times, the adhesion of the Teflon® film to different material surfaces (e.g., silicon, silicon dioxide, silicon nitride, copper, gold, chrome, etc.) is satisfactory in the presence of chemicals (e.g., water, photoresist developers, acetone, alcohol, HF, BHF, etc.) frequently used in MEMS fabrication. If desired, the film 5 can be patterned with, for example, oxygen plasma using a physical or photoresist mask.

5) Lastly, an electret 6 is formed by implanting electrons of about 10 keV energy into the dielectric film 5, preferably using a pseudo-spark electron gun. The electret 6 was then annealed in air at about 100° C. for about 3 hours to stabilize the charge.

The pseudo-spark electron gun, described below, is preferred because it operates at room temperature, the electron beam energy can be easily varied from about 5 keV to about 30 keV, the beam size is large (about several millimeters in diameter), it can deliver high electron doses ($10^{-9}$ to $10^{6}$ C), it has high throughput, and is low cost. However, other electron implantation methods may be used, such as a scanning electron beam, field emission electrode plate, corona charging, liquid contact, or thermal charging.

FIG. 1B is a process flow chart for electret microphone A, showing fabrication stages for the microphone back plate. FIG. 2B is a plan view of the completed microphone back plate of FIG. 1B. FIG. 2C is a closeup view of a section of the completed microphone back plate of FIG. 2B. The fabrication process involves the following steps:

1) The back plate electrode is fabricated starting with a silicon substrate 10 coated with an electrically insulating layer 11, preferably comprising about 3 μm of thermal oxide. Both sides of the substrate 10 are shown coated with the insulating layer 11, but only one side (the side containing the electrode) need be coated. Other materials, such as silicon nitride, may be used for the electrical insulating layer 11. Other electrically insulating or semiconducting glass, ceramic, crystalline, or polycrystalline materials can be used as the substrate 10 material.

2) Portions of the insulating layer 11 are masked and etched to the substrate 10 to form an etching window. The exposed substrate 10 is then etched through the etching window to form a recess 12. In the preferred embodiment, a timed KOH etch is used to create an approximately 3 μm recess 12 in the substrate 10. The window and recess 12 form the air gap of the capacitive electret microphone.

3) An electrically insulating layer 13 is then grown, filling the recess 12. The insulating layer 13 preferably comprises about 3 μm of thermal oxide.

4) The insulating layer 13 is then patterned to form an array of cavities 14 for reducing air streaming resistance during microphone operation. In the preferred embodiment, the cavity array is 40×40, and is formed by anisotropic etching (e.g., by KOH) followed by isotropic etching (e.g., by hydrofluoric acid + nitric acid + acetic acid) through the patterned insulating layer 13. In the illustrated embodiment, each cavity has about a 30 μm diameter opening, and comprises a half-dome shaped hole about 80 μm in diameter and about 50 μm deep.

5) Lastly, a back plate electrode 15 is deposited on part of the insulating layer 13, preferably by evaporation of about a 2000 Å thick layer of Cr/Au through a physical mask. Other conductors may be used, such as aluminum or copper, and deposited in other fashions, such as thick film printing.

For electret microphone A, the fundamental resonant frequency of the microphone membrane with a Cr/Au membrane electrode 4 and a Teflon electret film 6 was measured using a laser Doppler vibrometer. The fundamental resonant frequency was found to be around 38 kHz.

Figure 3:
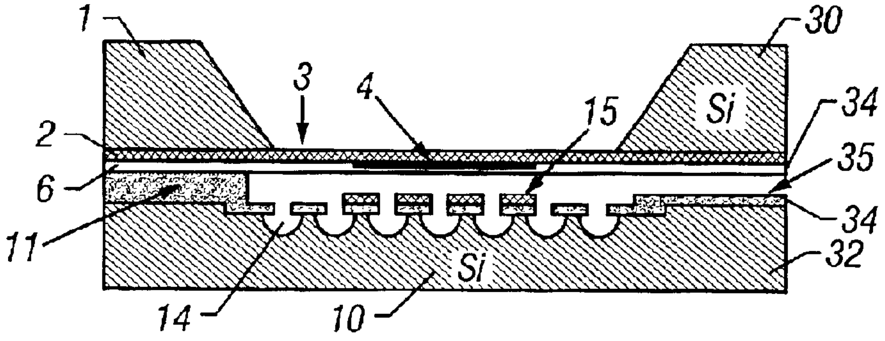
FIG. 3 is a cross-sectional view of the completed hybrid electret microphone of a first embodiment of the present invention.

FIG. 3 is a cross-sectional view of the completed hybrid electret microphone A. The microphone membrane 30 and back plate 32 are shown juxtaposed such that the electret 6 is positioned approximately parallel to but spaced from the back plate electrode 15 by a gap 34. The microphone membrane 30 and back plate 32 may be mechanically clamped together, or bonded adhesively, chemically, or thermally. If desired, the completed microphone may be enclosed in a conductive structure to provide electromagnetic (EM) shielding. If the microphone membrane 30 and back plate 32 are hermetically sealed together in a vacuum chamber, the cavities 14 and the steps required for their formation may be omitted, since air streaming resistance would not pose a problem. Otherwise, a static pressure compensation hole 35 may be provided.

While the electret 6 is shown as being formed on the membrane 30, similar processing techniques can be used to form the electret 6 on the facing surface of the back plate 32, or on both the membrane 30 and the back plate 32.

To reduce stray capacitance, the total electrode area was designed so that it only covered a fraction of the area of the microphone membrane 30 and back plate 32. In the experimental microphone A prototype, only 2×2 mm electrodes were used to cover the center part of a 3.5×3.5 mm diaphragm 3 and a 4×4 mm perforated back plate 32. The fraction of the back plate area occupied by the cavity openings was 0.07 in this prototype. The streaming resistance, $R_a$, was calculated to be 0.03 Ns/m. The cut-off frequency ($f_c$ =13.57 σ h/{2πR$_a$}, whereσ=100 MPa is the diaphragm 3 stress and h=1 μm is the diaphragm 3 thickness) was calculated to be approximately 7.6 kHz.

The theoretical capacitance of microphone A was 7 pF with a 4.5 μm air gap, a 1 μm thick Teflon electret 6, and an electrode area of 4 $mm^2$. Using a Hewlett Packard 4192 LF Impedance Analyzer, the measured capacitance of the completed microphone A package was about 30 pF. The discrepancy in capacitance values can be attributed to stray capacitance between the electrodes and silicon substrates and between the two clamped silicon substrate halves of the microphone.

Microphone A was able to detect the sound from a loud human voice without the use of an amplifier. When the microphone was connected to an EG&G PARC model 113 Pre-amp (gain set at 1000) and was excited by a Bruel & Kjaer Type 4220 Pistonphone operating at 250 Hz and 123.9 dB (re. 20 μPa) amplitude, the oscilloscope displayed a 250 Hz, 190 mV peak-to-peak amplitude signal. The estimated open-circuit sensitivity of the microphone A is 0.3 mV/Pa. The open-circuit sensitivity of the microphone can also be estimated by calculating the deflection of the electret diaphragm 3 and the output voltage due to a sound pressure. Assuming piston-like movement of the conducting area of the diaphragm 3, calculations indicate that higher open-circuit sensitivities are achievable.

Electret Microphone B

Figure 4:
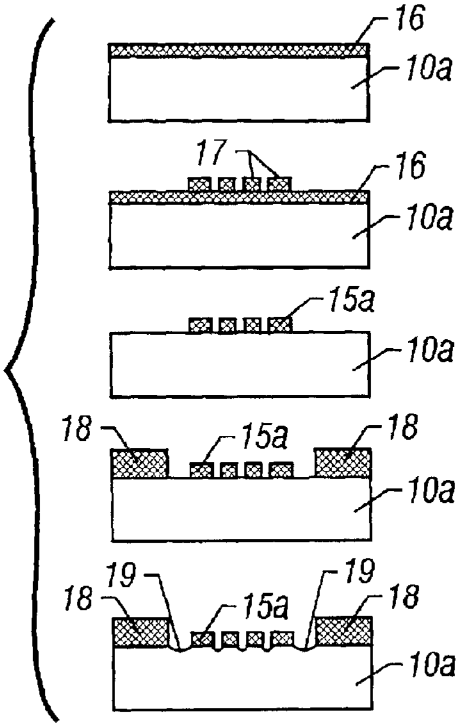
FIG. 4 is a process flow chart for the electret microphone of a second embodiment of the present invention, showing fabrication stages for the microphone back plate.

To reduce the stray capacitance between the electrodes and substrates and between the two clamped silicon substrate halves of microphone A, a second electret microphone B was fabricated. Fabrication of the microphone B membrane is the same as for microphone A, but with a 1.2 μm thick electret layer implanted with 7 keV electrons. However, microphone B uses a glass back plate. FIG. 4 is a process flow chart showing fabrication stages for the microphone B back plate.

1) The back plate of microphone B is fabricated starting with a glass substrate 10*a* coated with a conductive layer 16 on one side, preferably about 2500 Å of Cr/Au. Again other conductors could be used (although in the preferred embodiment, if buffered hydrofluoric acid is used in the last stage etch, certain metals, such as Al or Cu, should be avoided. This limitation can be avoided by using other etching techniques). Further, the substrate 10*a* could be an electrically insulating ceramic, crystalline, or polycrystalline material.
2) Portions of the conductive layer 16 were masked with patterned photoresist 17.
3) The exposed portions of the conductive layer 16 were then etched to form the patterned back plate electrode 15*a*.
4) A spacer 18 was then formed, preferably by applying and patterning a photoresist layer about 5 μm thick.
5) A cavity array 19 is then formed in the glass substrate 10*a*, preferably using a timed buffered hydrofluoric acid (BHF) etch. These cavities serve to reduce the air streaming resistance. In the illustrated embodiment, each cavity has about a 40 μm diameter opening and a half-dome shaped hole about 70 μm in diameter and about 15 μm deep.

The electret microphone B was tested in a B&K Type 4232 anechoic test chamber with built-in speaker and was calibrated against a B&K Type 4136 ¼ inch reference microphone. When microphone B was connected to an EG&G Model 113 Pre-amp and was excited by a sinusoidal input sound source, a clear undistorted sinusoidal output signal was observed. By applying a known input sound pressure level (SPL) from 200 Hz to 10 kHz, the frequency response of microphone B was obtained. The open circuit sensitivity of microphone B was found to be on the order of 0.2 mV/Pa and the bandwidth is greater than 10 kHz. At 650 Hz, the lowest detectable sound pressure was 55 dB SPL (re. 20 μpa). The open circuit distortion limit was found to be above 125 dB SPL, the maximum output of the speaker. This translates into a dynamic range that is greater than 70 dB SPL. The performance characteristics of microphone B are comparable to other microphones of similar size, and preliminary calculations suggest potentially higher sensitivities and wider dynamic range are achievable.

Packaging for microphone B was the same as for microphone A, as was the formation of limited area electrodes to reduce stray capacitance. The measured resonance frequency of the membrane was approximately 38 kHz.

The theoretical capacitance of microphone A was 4.9 pF with a 5 μm air gap, a 1.2 μm thick Teflon electret 6, and an electrode area of 3.14 $mm^2$. Using a Hewlett Packard 4192 LF Impedance Analyzer, the measured capacitance of the completed microphone B package was about 5.2 pF. The close agreement between theoretical capacitance value and the experimental value can be attributed to the glass substrate, which practically eliminates stray capacitance between the electrodes and substrate and between the two clamped halves of the microphone.

Pseudo-spark Electron Gun

Figure 5:
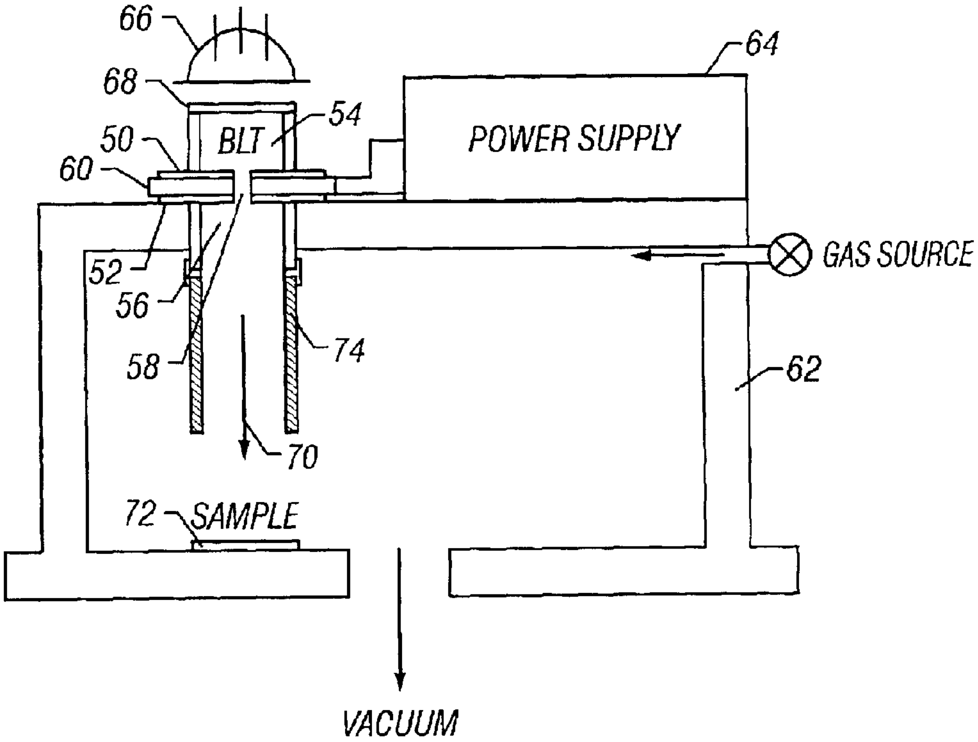
FIG. 5 is a diagram of a preferred back-light thyratron charge implantation system for make electret film in accordance with the present invention.

A pseudo-spark electron gun was used for electron implantation into the thin PTFE dielectric film. FIG. 5 is a diagram of a preferred back-lighted thyratron (BLT) charge pseudo-spark electron gun for making electret films in accordance with the present invention. The BLT structure comprises two electrode plates 50, 52 with a hollow-back cathode 54 and a hollow-back anode 56. In the illustrated embodiment, the two electrodes 50, 52 face each other and have a diameter of about 75 mm and a center aperture 58 of about 5 mm. The electrodes 50, 52 are separated by an insulating plate 60, such as plexiglass, quartz, etc., about 5 mm thick. The structure is filled with a low pressure gas, such as hydrogen or one of the noble gases, to a pressure of about 50 to about 500 mTorr, maintained by a vacuum chamber 62 coupled to a pump (not shown). A high voltage power supply 64 provides an electric bias potential between the electrodes 50, 52.

The BLT device is triggered optically by an ultraviolet light pulse applied to the back of the cathode 54. That is, light from a UV source 66 (for example, a flashlamp) passes through a UV transparent window (e.g., quartz) 68 into the back of the cathode 54. This initiates a pulsed electron beam 70 which is directed towards a thin film dielectric sample 72. Integrating a dielectric collimating tube 74 at the beam exit from the center aperture 58 has the effect of collimating and focusing the electron beam 72.

In an alternative embodiment, the thyratron device of FIG. 5 may be triggered with an electrical pulse applied to the cathode region 54. The electrical pulse generates electrons which initiate the electron beam 70.

In one experimental setup, a BLT was constructed on top of a vacuum chamber 62 with a triggering UV flashlamp 66 at a distance of about 2 cm away from the UV transparent (quartz) window 68. The cathode 54 was biased at a high negative potential for beam acceleration. The electron beam pulse 70 was directed to the sample 72 positioned about 12 cm away from the beam exit from the center aperture 58. With a divergent angle of about 6°, the beam diameter was about 1.75 cm at the sample surface. The bias potential was adjusted according to the desirable range of electrons in the dielectric sample 72. For microphone A, which has a silicon back plate and 1 $\mu$m thick Teflon film, the electron beam energy was set at 10 keV, which gives an implantation depth of approximately 1 $\mu$m. For microphone B, which has a glass back plate and 1.2 $\mu$m thick Teflon film, the electron beam energy was set at 7 keV, which gives an implantation depth of less than 1 $\mu$m.

Charge Density Measurements

To measure the charge density on the electrets, a setup consisting of a PZT stack and a micrometer controlled stationary electrode was constructed. To confine displacement in the z-direction only, the PZT was integrated into a flexure hinge made of 304 stainless steel and machined by electrical discharge machining (EDM). The movable part of the flexure hinge weighed 30 g and had a spring constant of $1.53\times10^{6}$ N/m. The PZT driver deforms 15 $\mu$m at 100 V and can be driven by a maximum voltage of 150 V. The linearity of the displacement of the PZT caused by hysteresis was 10%. The PZT was driven by a unit consisting of a periodic source and an amplifier. The amplifier was a class-B push-pull type amplifier specially designed for capacitive loads. An eddy-current sensor was integrated into the micrometer for monitoring and double checking dynamic and static displacements. A test sample was prepared using 1.2×1.2 cm silicon die evaporated with about 2000 Å of Cr/Au. A 1 $\mu$m thick layer of Teflon AF 1601S was coated on the Au surface and then implanted with 10 keV electrons using the BLT described above at 420 mTorr of helium.

The electret sample was fixed on top of the vibrating flexure hinge. The signal generated by induced charges on the stationary electrode due to the vibrating electret was then displayed on an oscilloscope. By applying a compensation potential, $U_0$, between the two electrodes, the net electric field in the air gap between the vibrating and stationary electrode can be reduced to zero. The signal generated by the induced charges thus becomes zero. The effective surface charge density, $\rho_{eff}$, of the electret sample is then given by:

$$\rho_{eff}=\epsilon_0\epsilon U_0/t$$

where $\epsilon_0$ is the permitivity of air, $\epsilon=1.9$ is the relative permitivity of the Teflon film, and t is the electret thickness. Depending on the number of electron pulses, the charge density of an electret sample ranged from about $2\times10^{-5}$ C/m$^2$ to about $8\times10^{-4}$ C/m$^2$. The maximum charge density obtained is comparable to what has been reported for Teflon films.

It was found from experiment that at room temperature the electret initially undergoes a 10–20% drop in total charge density a few hours after implantation, but then stabilizes afterward. Some samples were monitored at room temperature over a period of six months and no detectable charge decay was observed. Samples have also been tested for charge decay at elevated temperatures in air. The charge density of a sample at 100° C. dropped about 40% drop in the first 2 hours, due to the elevated temperature. However, even at 100° C. the charge stabilized after the initial drop to a rate which is not measurable within the time span of the experiment (16 hours). The same electret sample was then monitored for charge decay at 120° C. Again there was an initial drop in charge density, but the charge stabilized after a few hours. The same trend was observed for the same sample at 140° C., and for a different sample at 130° C. and 160° C. It was also discovered that at 190° C. the electret tested lost more than 80% of its charge within a few hours.

Using these thermal annealing data, a procedure was devised to stabilize the charge in an electret made in accordance with the invention by thermally annealing the electret in air at about 100° C. for about 3 hours essentially immediately after charge implantation. After thermal annealing, the result is a stable electret at room temperature. When one such thermally annealed electret sample was exposed to UV light (365 nm at 3.85 mW/Cm$^2$, 400 nm at 8.5 mW/cm$^2$) for one hour, no charge decay was observed.

Although only short term data has been available so far, the charge decay data obtained at room and elevated temperatures and in the presence of UV light suggests that a stable electret can be formed using PTFE (particularly Teflon® AF) and the BLT.

SUMMARY

The electret of the present invention can be used in any application were a conventional electret can be used. In particularly, the electret microphone of the present invention can be used in any application were a conventional electret microphone can be used. In addition, because of its extremely small size and self-powering characteristics, an electret microphone made in accordance with the invention can contribute to further miniaturization of devices such as portable telecommunications devices, hearing aids, etc. Moreover, such an electret microphone can be used as a powered sound generator, allowing one or more of the units to be used, for example, in a hearing aid as a speaker. If multiple microphones are used, the frequency response of each can be tuned to desired values by changing the stiffness of the diaphragm 3 (e.g., by changing its thickness or in-plane residual stress) or by changing the area of the diaphragm 3.

Since the MEMS processes used in fabricating electrets and electret microphones in accordance with the present invention are compatible with fabrication of integrated circuitry, such devices as amplifiers, signal processors, filters, A/D converters, etc., can be fabricated inexpensively as an integral part of the electret-based device. Further, the low cost of manufacture and the ability to make multiple microphones on a substrate wafer permits use of multiple microphones in one unit, for redundancy or to provide directional sound perception.

The high charge density, thin film stable electret technology of the present invention can also be used in applications other than microphones, such as microspeakers, microgenerators, micromotors, microvalves, and airfilters.

A number of embodiments of the present invention have been described. Nevertheless, it will be understood that various modifications may be made without departing from the spirit and scope of the invention. For example, other etchants, metals, mask and substrate materials, lithographic methods, etching techniques, etc., may be used in place of the specific materials and methods described above. Other dimensions for thicknesses, sizes, etc. can also be used to achieve desired performance or fabrication parameters. While square microphones are shown, other shapes, such as round, hexagonal, or ellipsoid, can also be fabricated. Further, some specific steps may be performed in a different order to achieve similar structures. Accordingly, it is to be understood that the invention is not to be limited by the specific illustrated embodiment, but only by the scope of the appended claims.

What is claimed is:

1. A method of fabricating an electret by the step of forming, an electret layer on a support structure by spinning on the electret layer; and forming charge on said electret layer.

2. The method of claim 1, further including the step of thermally annealing the electret layer to stabilize said charge in said electret layer.

3. A method as in claim 1, wherein said forming comprises forming a support structure, and forming a dielectric film on the support structure.

4. The method of claim 1, wherein the support structure is formed from an electrically insulating or semiconducting glass, ceramic, crystalline, or polycrystalline material.

5. The method of claim 1, wherein the support structure comprises a membrane fabricated to a thickness of about 1 $\mu$m.

6. The method of claim 1, wherein the electret layer is formed by the steps of:

(a) applying a dielectric film on the support structure;

(b) implanting electrons into the dielectric film.

7. The method of claim 6, further including the step of implanting electrons into the dielectric film by means of a pseudo-spark electron gun.

8. The method of claim 6, wherein the dielectric film is formed from one of a PTFE fluoropolymer, a silicone, or Parylene.

9. A method as in claim 1, wherein the electret has a saturated charge density sufficient to enable it to operate as an electret.

10. A method as in claim 9, wherein the electret is formed with a support structure of substantially 1 $\mu$m thick, and an electret layer substantially 1 $\mu$m thick.

11. A method as in claim 9, further comprising implanting electrons into the dielectric film to form said saturated charge density.

12. A method as in claim 11, further comprising stabilizing said electrons.

13. A method as in claim 11, wherein said implanting electrodes comprises implanting electrodes with an energy between 5 keV and 30 keV.

14. A method of fabricating an electret by the step of forming, by micro-machining techniques, an electret layer on a support structure, and forming charge on said electret layer;

further including the step of thermally annealing the electret layer to stabilize said charge in said electret layer; and wherein the step of thermally annealing comprises heating the electret layer to about 100° C. for about 3 hours.

15. A method of fabricating an electret by the step of forming, by micro-machining techniques, an electret layer on a support structure, and forming charge on said electret layer; and wherein the electret has a saturated charged density from about $2\times10^{-5}$ C/m$^2$ to about $8\times10^{-4}$ C/m$^2$.

16. A method of fabricating an electret by the step of forming, by micro-machining techniques, an electret layer on a support structure, and forming charge on said electret layer;

wherein said forming comprises forming a support structure, and forming a dielectric film on the support structure; and wherein said forming a dielectric film comprises spinning on the dielectric film.

17. A method as an claim 16, wherein said dielectric film is PTFE.

18. A method, comprising:

obtaining a support structure;

forming a dielectric layer of PTFE on the support structure, said dielectric layer being substantially 1.2 $\mu$m or thinner; and forming a saturated charge density on the dielectric layer sufficient to enable said dielectric layer to operate as an electret.

19. A method as in claim 18, wherein said forming a saturated charge density comprises implanting electrons into said dielectric layer.

20. A method as in claim 19, further comprising stabilizing said electrons.

21. A method as in claim 18, wherein said obtaining a support structure comprises obtaining a silicon substrate, forming another layer on said silicon substrate; and etching a hole in said silicon substrate to lead a freestanding portion of said another layer which forms said support structure.

22. A method as in claim 21, wherein said support structure is formed of silicon nitride.

23. A method as in claim 21, wherein said another structure is substantially 1 $\mu$m thick.

24. A method, comprising:

obtaining a silicon substrate with a silicon nitride coating thereon, said silicon nitride coating being substantially 1 $\mu$m thick;

etching a hole in said silicon substrate to leave a free-standing portion of said silicon nitride coating;

spinning on a dielectric on top of said silicon, nitride coating; and forming a saturated charge density on the dielectric layer, sufficient to enable said dielectric layer to operate as an electret and stabilizing said charge layer on said dielectric layer.

* * * * *